US010573148B1

(12) United States Patent
Gomez (10) Patent No.: US 10,573,148 B1
(45) Date of Patent: Feb. 25, 2020

(54) ELECTRICAL SOCKET CONTACT WARNING AND SAFETY DEVICE

(71) Applicant: Carlos Gomez, Brooklyn, NY (US)

(72) Inventor: Carlos Gomez, Brooklyn, NY (US)

( * ) Notice: Subject to any disclaimer, the term of this patent is extended or adjusted under 35 U.S.C. 154(b) by 0 days.

(21) Appl. No.: 16/231,707

(22) Filed: Dec. 24, 2018

(51) Int. Cl.

| G08B 21/02 | (2006.01) |
|---|---|
| G06F 3/044 | (2006.01) |
| G08B 6/00 | (2006.01) |
| G08B 27/00 | (2006.01) |
| G08B 5/36 | (2006.01) |
| G08B 3/10 | (2006.01) |

(52) U.S. Cl.
CPC .............. *G08B 21/02* (2013.01); *G06F 3/044* (2013.01); *G08B 3/10* (2013.01); *G08B 5/36* (2013.01); *G08B 6/00* (2013.01); *G08B 27/005* (2013.01)

(58) Field of Classification Search
CPC ............ G08B 21/02; G08B 6/00; G06F 3/044
USPC ...................................................... 340/573.1
See application file for complete search history.

(56) References Cited

U.S. PATENT DOCUMENTS

| 5,180,886 | A | * | 1/1993 | Dierenbach | .............. | H02G 3/14 |
| | | | | | | 174/66 |
| 6,108,178 | A | | 8/2000 | Beadles | | |
| 7,026,550 | B2 | | 4/2006 | McBain | | |
| 7,385,521 | B2 | | 6/2008 | Macari | | |
| 8,093,497 | B2 | | 1/2012 | White | | |
| 8,467,734 | B2 | | 6/2013 | Schubert | | |
| 8,669,484 | B1 | | 3/2014 | Benson | | |
| 9,722,344 | B1 | * | 8/2017 | Hamilton | .............. | H01R 13/453 |
| 2013/0040495 | A1 | * | 2/2013 | Moss | .................... | H01R 13/447 |
| | | | | | | 439/625 |

* cited by examiner

*Primary Examiner* — John A Tweel, Jr.
(74) *Attorney, Agent, or Firm* — Goldstein Law Offices, P.C.

(57) ABSTRACT

A safety device for securing an electrical socket against contact by a person's finger, comprising a housing having a front face, a rear face, a touch sensor adapted to detect a touch event corresponding to contact between the finger and the front face, and an electrical plug adapted to be inserted into the electrical socket while the housing prevents the person from accessing the electrical socket. The safety device further has a simulated electrical socket on the front face which is non-conductive and visually resembles the electrical socket, as well as a warning light, a sound emitter, and a vibration motor for warning the person upon detecting the touch event, so that the person associates the warning with the visual appearance of the electrical socket and is deterred from contact therewith. The safety device is further adapted to wirelessly transmit a touch alert warning to a remote user device.

20 Claims, 7 Drawing Sheets

ELECTRICAL SOCKET CONTACT WARNING AND SAFETY DEVICE

TECHNICAL FIELD

The present disclosure relates generally to a safety device for securing an electrical socket. More particularly, the present disclosure relates to a safety device which protects the electrical socket from direct access, deters a person from contacting the safety device, and warns a user anytime the safety device is touched.

BACKGROUND

Electrical sockets pose a constant danger to children who may be electrocuted while playing with or otherwise tampering with the sockets. Various protective devices exist in the prior art which are designed to protect children by covering or otherwise securing electrical sockets. Such protective devices range from simple plugs which cover the electrical socket and are difficult to remove, to electronic protective devices which trigger an alarm when the device is contacted or tampered with. Other prior art protective devices are also capable of broadcasting an alert to inform parents that tampering is occurring, allowing parents to intervene.

However, the large number of electrical sockets in a typical home makes it impractical for parents to secure every electrical socket which children can reach. Simple electrical socket covers do not prevent a diligent child from tampering with and ultimately removing the cover over time, while more sophisticated alarm-equipped protective devices still must be removed to allow the electrical sockets to power electric appliances, lights, and other devices, exposing the now unprotected electrical socket to access by children. Furthermore, it is an unfortunate side-effect of extensively using protective devices that an exposed electrical socket may arouse a child's curiosity precisely because the electrical socket is normally kept hidden from view. A child may learn that tampering with a protective device will produce an unpleasant sensation such as a loud alarm or result in a scolding from a parent. However, an unprotected electrical socket bears no such unpleasant association.

Therefore, a need exists for a protective device which, in addition to the standard protective, alarm, and notification functions which prior art devices are capable of, can train children to avoid electrical sockets by forming an association between the unpleasantness of alarms and the visual appearance of electrical sockets, thus teaching children to avoid all electrical sockets, including those which are unsecured by any protective devices.

In the present disclosure, where a document, act or item of knowledge is referred to or discussed, this reference or discussion is not an admission that the document, act or item of knowledge or any combination thereof was at the priority date, publicly available, known to the public, part of common general knowledge or otherwise constitutes prior art under the applicable statutory provisions; or is known to be relevant to an attempt to solve any problem with which the present disclosure is concerned.

While certain aspects of conventional technologies have been discussed to facilitate the present disclosure, no technical aspects are disclaimed and it is contemplated that the claims may encompass one or more of the conventional technical aspects discussed herein.

BRIEF SUMMARY

An aspect of an example embodiment in the present disclosure is to provide a device which is adapted to protect an electrical socket from direct contact by a person, as well as to deter the person from contacting the electrical socket. Accordingly, the present disclosure provides a safety device comprising a housing having a front face and a rear face, the housing further has a touch sensor adapted to detect the occurrence of a touch event were the person's finger comes into contact with the front face, and an electrical plug projecting away from the rear face which is adapted to be inserted into the electrical socket. Once the electrical plug is inserted into the electrical socket, the housing of the safety device prevents the person from accessing or contacting the electrical socket. The safety device further has a vibration motor positioned within the housing which activates once the person touches the front face to deliver a tactile warning resembling simulated electric shock, to deter the person from contacting the safety device.

Another aspect of an example embodiment in the present disclosure is to provide a device which generates harmless but unpleasant sensations to deter the person from contacting the safety device. Accordingly, the present disclosure provides a safety device further comprising a warning light and a sound emitter. Upon the person touching the front face, the warning light flashes to produce a visual warning while the sound emitter produces an audible warning. The visual, audible, and tactile warnings combine to produce an unpleasant sensation to deter the person from contacting the safety device.

It is yet another aspect of an example embodiment in the present disclosure to provide a device which deters the person from contacting an electrical socket even when the electrical socket is unprotected. Accordingly, the present disclosure provides a safety device which further has a simulated electrical socket which has a visual resemblance to the electrical socket. The simulated electrical socket is non-conductive and forms a part of the touch sensitive front face, and the safety device is adapted to allow the person to associate the unpleasant sensation produced by the tactile, visual, and audible warnings with the visual appearance of the electrical socket, thereby deterring the person from contacting any electrical socket even in the absence of the safety device.

It is still yet another example embodiment in the present disclosure to provide a device which warns a user whenever a person contacts the device. Accordingly, the present disclosure provides a safety device which is adapted to wirelessly communicate with a remote user device running a touch alert application and transmit a touch alert upon detecting contact between the person and the front face of the safety device.

It is still a further example embodiment in the present disclosure to provide a device which prevents the person from detaching the electrical plug from the electrical socket. Accordingly, the present disclosure provides a safety device which includes means for preventing the person from removing the safety device, including a curved housing which prevents the person from establishing a grip on the safety device, a securing screw which fastens the safety device to the faceplate of the electrical socket, and enlarged prongs in the electrical plug which frictionally engage with the electrical socket to prevent the electrical plug from being detached by hand.

The present disclosure addresses at least one of the foregoing disadvantages. However, it is contemplated that the present disclosure may prove useful in addressing other problems and deficiencies in a number of technical areas. Therefore, the claims should not necessarily be construed as limited to addressing any of the particular problems or deficiencies discussed hereinabove. To the accomplishment of the above, this disclosure may be embodied in the form illustrated in the accompanying drawings. Attention is called to the fact, however, that the drawings are illustrative only. Variations are contemplated as being part of the disclosure.

BRIEF DESCRIPTION OF THE DRAWINGS

In the drawings, like elements are depicted by like reference numerals. The drawings are briefly described as follows.

The present disclosure now will be described more fully hereinafter with reference to the accompanying drawings, which show various example embodiments. However, the present disclosure may be embodied in many different forms and should not be construed as limited to the example embodiments set forth herein. Rather, these example embodiments are provided so that the present disclosure is thorough, complete and fully conveys the scope of the present disclosure to those skilled in the art.

DETAILED DESCRIPTION OF THE PREFERRED EMBODIMENTS

Figure 1:
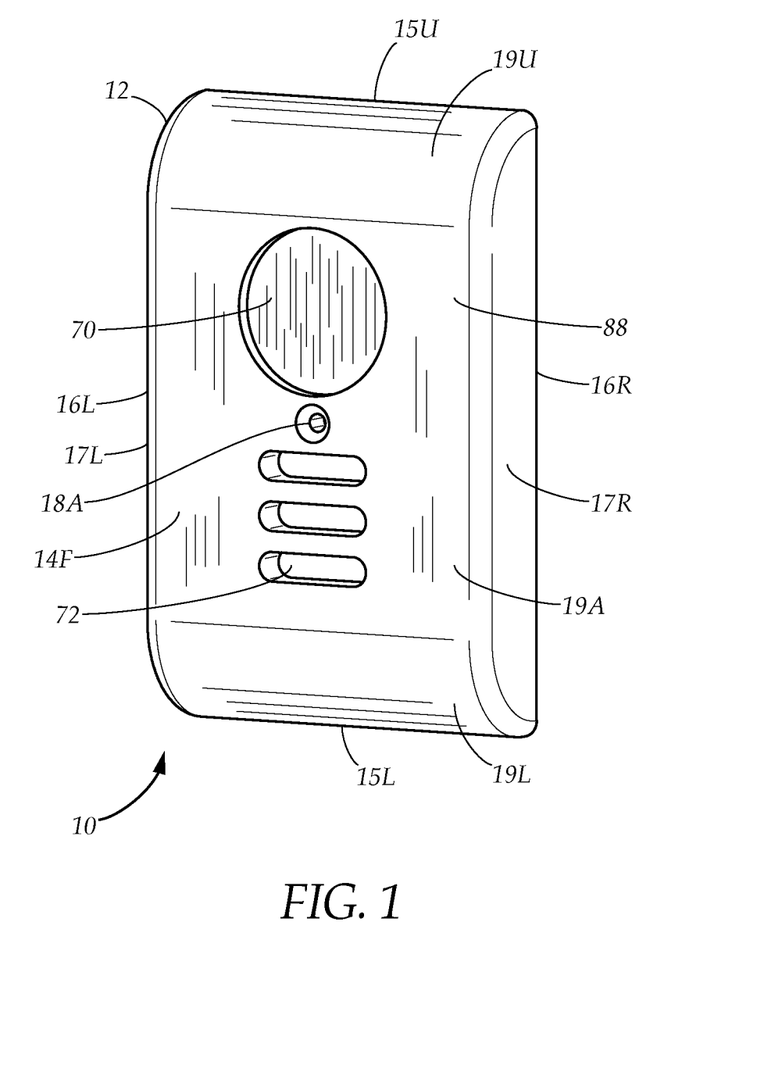
FIG. 1 is a diagrammatical perspective view of an electrical socket warning and safety device comprising a housing with a touch sensitive front face, a warning light, and a sound emitter, in accordance with an embodiment of the present disclosure.
Figure 2:
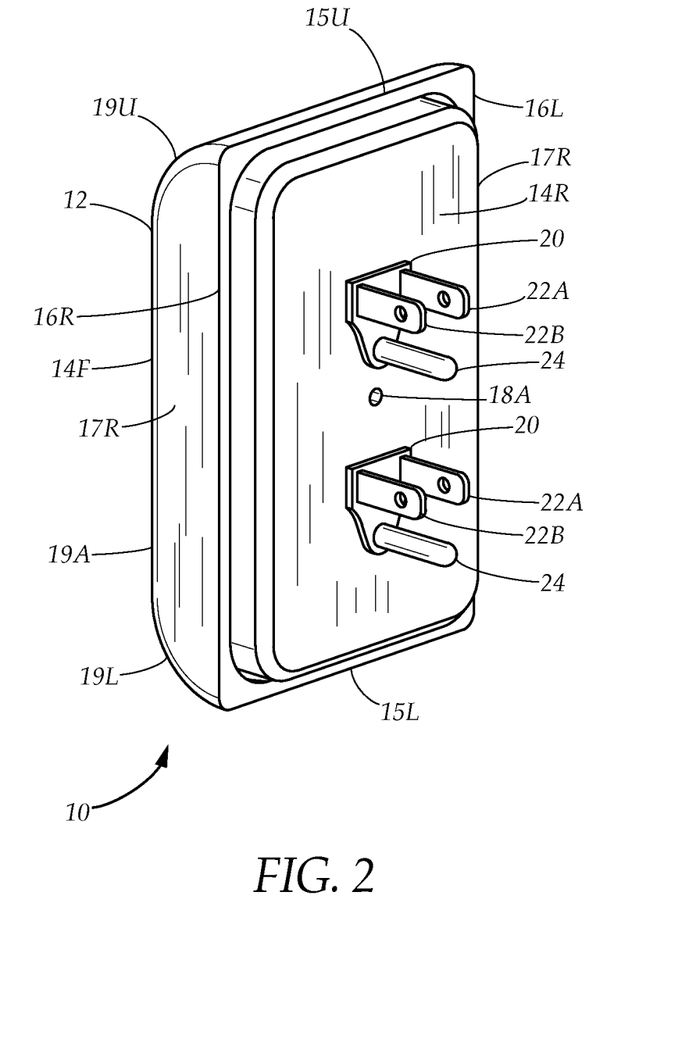
FIG. 2 is a diagrammatical perspective view of the safety device viewed from the rear, showing a rear face having a plurality of electrical plugs, in accordance with an embodiment of the present disclosure.
Figure 3:
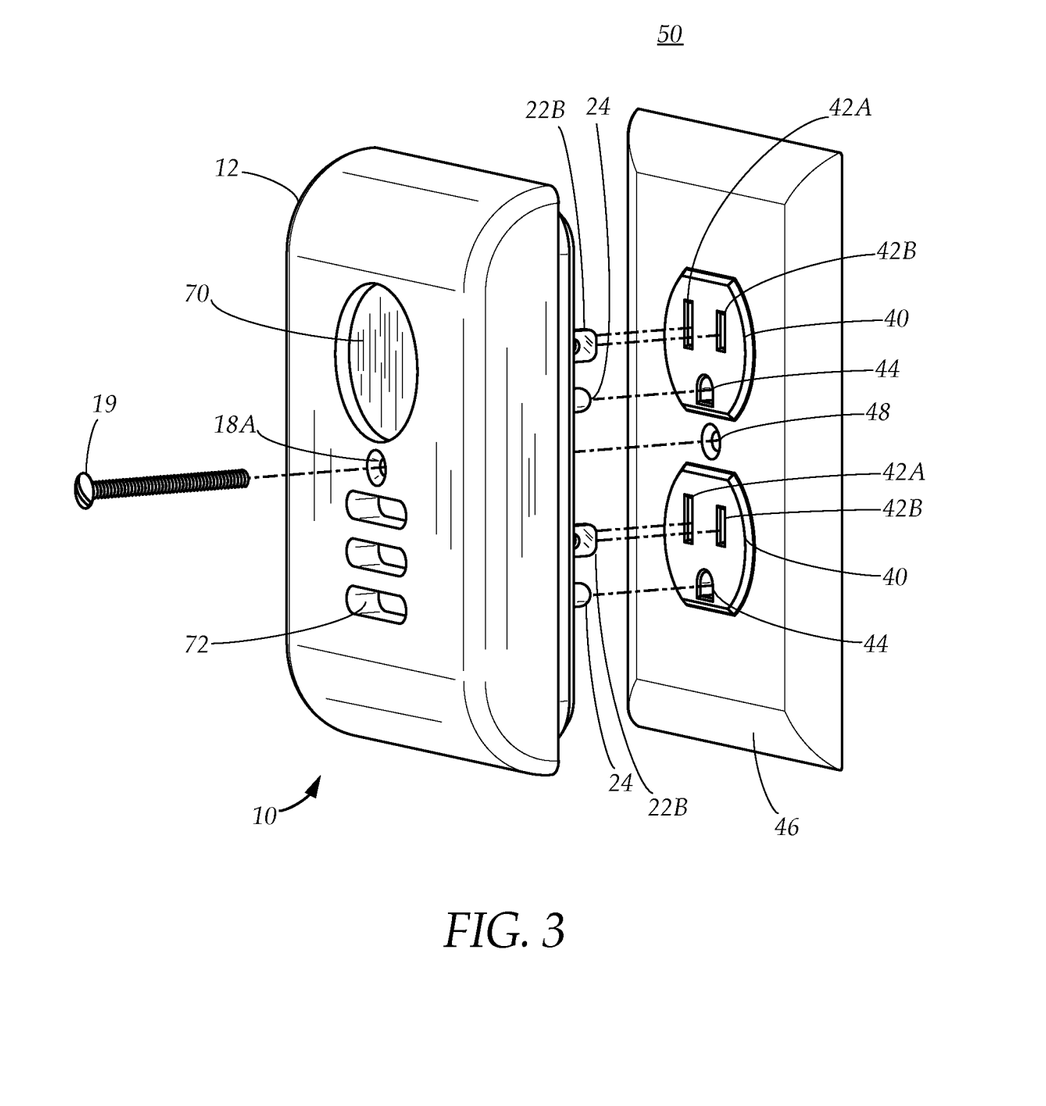
FIG. 3 is a diagrammatical perspective view of the safety device aligned with an electrical socket and faceplate assembly, whereby the safety device plugs into the electrical sockets and is secured to the faceplate using a securing screw, preventing direct access to the electrical sockets, in accordance with an embodiment of the present disclosure.
Figure 4:
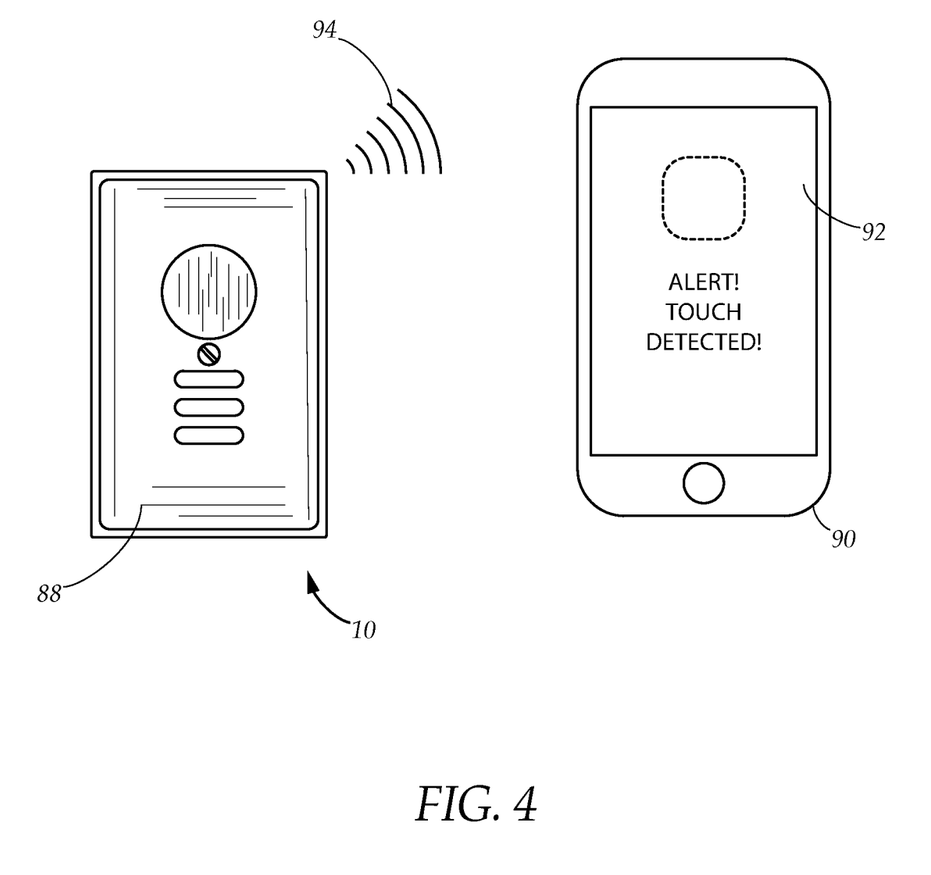
FIG. 4 is a diagrammatical front view of the safety device transmitting a touch alert signal to a remote user device, in accordance with an embodiment of the present disclosure.
Figure 5:
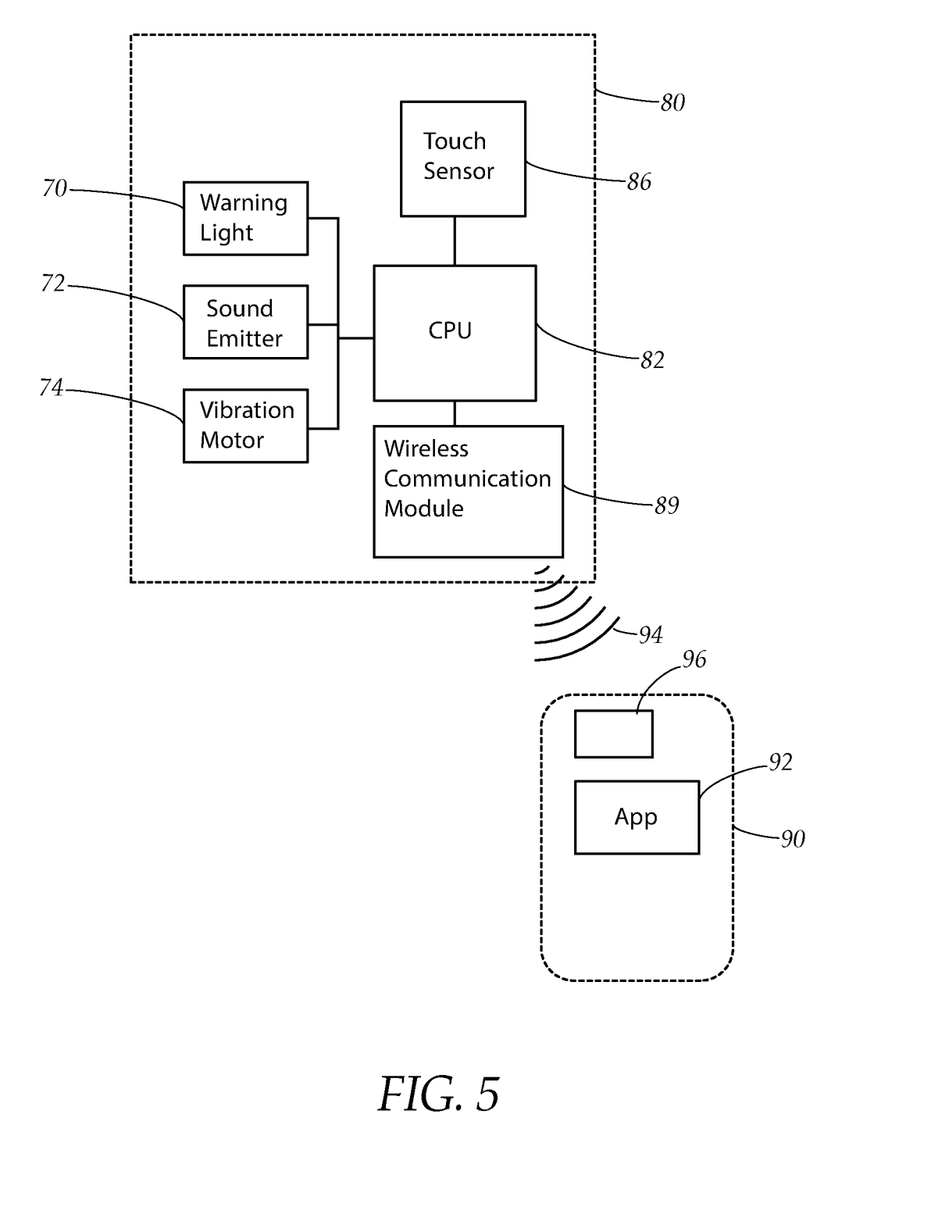
FIG. 5 is a block diagram depicting a control module adapted to control the functions of the safety device and communicate with the remote user device, in accordance with an embodiment of the present disclosure.

FIG. 1 illustrates an electrical socket warning and safety device 10 adapted to be secured to an electrical socket 40 as shown in FIG. 3, to prevent direct access to or contact with the electrical socket 40. The electrical socket 40 may be disposed within a face plate 46 which is affixed to a wall 50 or other structure. Continuing to refer to FIG. 1 while also referring to FIGS. 2-3, the safety device comprises a housing 12 having a front face 14F, a rear face 14R oriented opposite the front face 14F, and one or more electrical plugs 20 which extend from the rear face 14R, which are adapted to be inserted into the electrical socket 40 such that the rear face 14R becomes substantially flush with the face plate 46. Once the safety device 10 is secured to the electrical socket 40, the housing 12 remains parallel and adjacent to the electrical socket 40 and the faceplate 46, and prevents a person, particularly a child, from reaching or accessing the electrical socket 40. The safety device 10 further comprises a warning light 70 and a sound emitter 72 disposed on the front face 14F, and a touch-sensitive surface 88. In a preferred embodiment, the touch-sensitive surface is coextensive with the front face 14F. The touch-sensitive surface 88 detects the occurrence of a touch event whereby an object such as a finger comes into contact with the touch-sensitive surface 88, causing the warning light 70 to illuminate or flash, and the sound emitter 72 to produce a warning tone or a warning message. Referring to FIGS. 1, 3, and 5, the safety device 10 further comprises a vibration motor 74 which activates in conjunction with the warning light 70 and the sound emitter upon the occurrence of the touch event and is adapted to deliver vibrations through the housing 12 to the finger contacting the touch-sensitive surface 88. The safety device 10 is therefore adapted to deliver, upon the occurrence of the touch event, a visual warning through the warning light 70, an audible warning via the sound emitter 72, and a tactile warning through the vibration motor 74. The combined effect of each of these warnings creates unpleasant sensations which serves to deter the person from contacting the safety device 10 and the electrical socket 40 to which it is secured. Referring briefly to FIG. 4, the safety device 10 is further adapted to wirelessly transmit a touch alert signal 94 to a remote user device 90 upon the occurrence of the touch event, thus notifying a user that the person has contacted the safety device 10.

Figure 7:
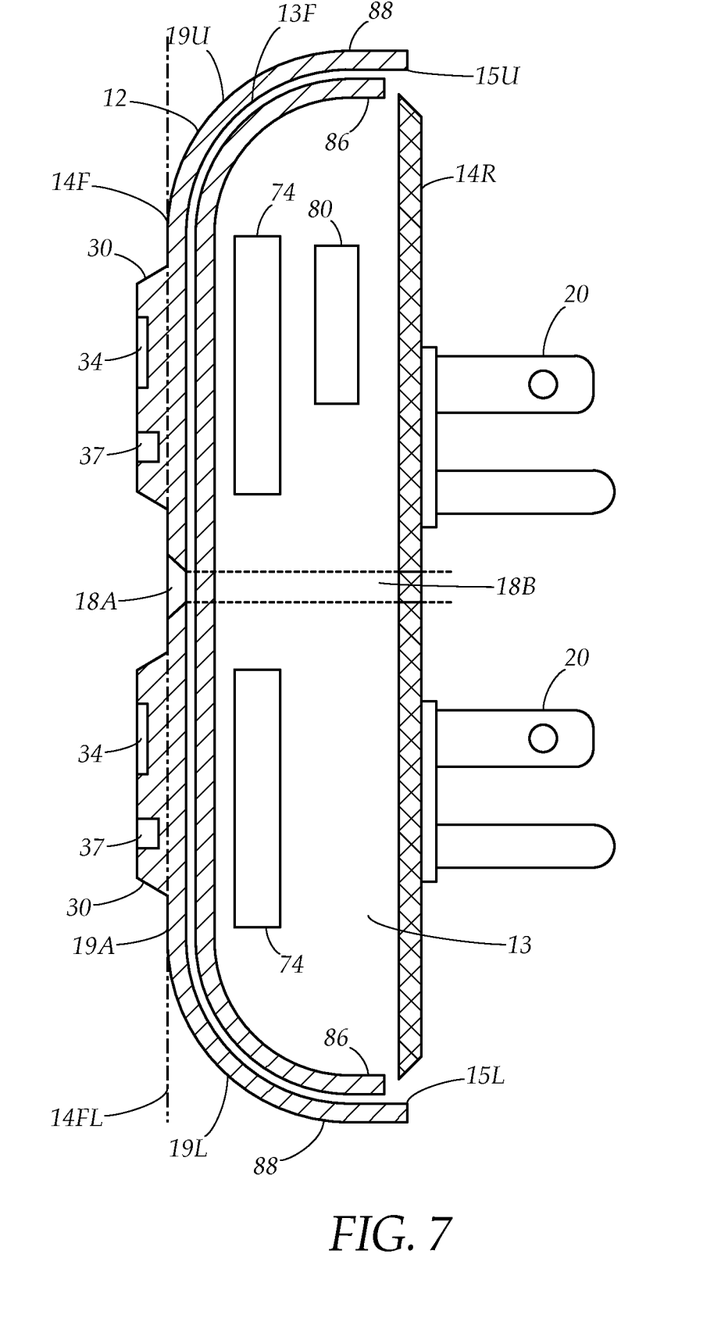
FIG. 7 is a diagrammatical cross section view of the safety device, showing the interior space as well as a plurality of depressions formed on the front face and disposed within the simulated electrical sockets, in accordance with an embodiment of the present disclosure.

Referring to FIG. 7 while continuing to refer to FIGS. 1-3, the front face 14F and the and the rear face 14R are separated by a thickness which allows the housing 12 to contain an interior space 13. The housing 12 may further have a housing inner surface 13F which faces inwardly towards the interior space 13, and may correspond to any portion of the front face 14F, the rear face 14R, or the curved side faces 17L, 17R facing inwardly towards the interior space 13. In a preferred embodiment, the rear face 14R is substantially rectangular, and further has an upper edge 15U, a lower edge 15L, and a pair of side edges 16L, 16R. The front face 14R may be formed in an arcuate shape where the front face is formed by an upper curved portion 19U, a central face 19A, and a lower curved portion 19L. The upper curved portion 19U and the lower curved portion 19L project away from the upper edge 15U and the lower edge 15L respectively and bend inwardly to join together at the central face 19A. The housing 12 may further comprise a pair of curved side faces 17L, 17R which extend between the front face 14F and the side edges 16L, 16R of the rear face. Each of the curved side faces 17L, 17R may bend inwardly towards each other as they project away from the rear face 14R. The arrangement of the upper and lower curved portions 19U, 19L and the curved side faces 17L, 17R creates a curved configuration and allows the housing 12 to be free of any corners thus preventing the person from establishing a sufficient hand grip sufficient to remove the safety device 10 from the electrical socket 40. The housing 12 is preferably formed out of a material which is strong but also non-conductive such as plastic. Alternatively, the housing 12 may also be formed partially from metal, as long as the housing is covered by a non-conductive layer. Note that the housing 12 may alternatively be formed in a variety of shapes, including circular or polygonal configurations, while remaining in accordance with the principles of the present disclosure.

Referring now to FIGS. 2-3 and FIG. 7, the faceplate 46 may have a screw hole 48 which is used to fasten the faceplate 46 against the wall 50. The safety device 10 may further comprise a securing screw hole 18A leading to a securing screw channel 18B which extends through the housing 12 between the front face 14F and the rear face 14R. The securing screw hole 18A allows a securing screw 19 to pass through the housing 12 via the securing screw channel 18B and into the screw hole 48 of the faceplate 46 while the safety device 10 is inserted into the electrical socket 40, thus securing the safety device 10 in place and preventing it from being removed. The securing screw 19 may be used in place of or in combination with the curved configuration of the housing 12.

Referring to FIGS. 5 and 7 while continuing to refer to FIG. 1, the safety device 10 further comprises a touch sensor 86. In a preferred embodiment, the touch sensor 86 is a capacitive touch sensor, such as capacitive touch film, and may be placed within the interior space 13 proximate to or in contact with the housing inner surface 13F opposite the front face 14F such that the front face 14F is within sensor range of the touch sensor. The touch sensor 86 is therefore positioned to detect the contact between a finger and the front face 14F, and the front face 14F corresponds to the touch-sensitive surface 88. Furthermore, additional touch sensors 86 may be positioned along the housing inner surface 13F opposite the curved side faces 17L, 17R, allowing the touch-sensitive surface 88 to further encompass the curved side faces 17L, 17R in addition to the front face 14F. Note that a wide range of alternatives may be employed to implement the touch sensor 86, as will be apparent to a person of ordinary skill in the art in the field of the invention, including proximity sensors, resistive sensors, or any other type of sensor adapted to detect the contact between a finger and the portion of the housing 12 which constitutes the touch-sensitive surface 88.

The control module 80 is adapted to control the functions of the safety device and comprises a processor 82 which is operably connected to the touch sensor 86, the warning light 70, the sound emitter 72, and the vibration motor 74, and further comprises a wireless communication module 89. The control module 80 and all the components of the safety device 10 are powered by electricity drawn from the electrical socket via the electrical plugs. When the touch event is detected by the touch sensor 86, the touch sensor 86 transmits a touch signal to the control module 80. The control module 80, upon receiving the touch signal, is adapted to activate the warning light 70, the sound emitter 72, and the vibration motor 74, and cause the safety device to produce the visual, audible, and tactile warnings. In certain embodiments, the control module 80 and the components of the safety device 10 may alternatively be powered via a battery positioned within the housing 12, and the battery may either be disposable or rechargeable.

The vibration motor 74 is positioned proximate to or in contact with the housing inner surface 13F to allow vibrations generated by the vibration motor to be transferred to any part of the housing 12 which corresponds to the touch-sensitive surface 88, including the front face 14F and the curved side faces 17L, 17R. In a preferred embodiment, the vibrations generated by the vibration motor 74 are sufficiently intense to deliver a tactile sensation similar to a simulated electrical shock, which is transferred through the housing 12 to the finger of the person in contact with the touch-sensitive surface 88. This tactile warning allows the person to perceive that contact with the actual electrical socket is dangerous and should be avoided. To complement the tactile warning, the visual warning produced by the warning light 70 may take the form of a flash or burst of light which occurs simultaneously with the tactile warning. The warning light 70 may be implemented using any combination of bulbs, LEDs, luminous panels, or other suitable light source, and can produce light in any color, as well as flash according to a pattern or provide steady illumination. For example, the visible warning may correspond to a red flash emitted by the warning light 70. Furthermore, the audible alert produced by the sound emitter 72 may be any sound suitable for use as a warning. For example, the audible alert can be a shrill warning sound such as that produced by a home smoke detector. Alternatively, the sound emitter 72 may be adapted to play a verbal message which warns the person that contact with the electrical socket is dangerous. In certain embodiments, the visual, audible, and tactile warnings may increase in intensity if the person continues to contact the touch-sensitive surface, in order to encourage the person to cease further contact with the safety device 10. Note that the example warnings provided are not intended to be limiting, and various combinations and patterns of light, sound, and vibration may be used to deliver an effective warning to the person in adherence with the principles of the present disclosure. The visual, audible, and tactile warnings are intended to constitute non-harmful, but unpleasant sensations for the person, when employed individually or in combination.

Returning now to FIG. 4 while continuing to refer to FIG. 1 and FIG. 5, the wireless communication module 89 is adapted to wirelessly transmit data via a communication protocol such as WI-FI, Bluetooth, or any suitable protocol known to a person of ordinary skill in the art in the field of the invention. The wireless communication module 89 allows the safety device 10 to transmit the touch alert signal 94 to the remote user device 90, which can be a smartphone, tablet, personal computer, or any other computing device having a display and which has a wireless communication receiver 96 capable of wirelessly receiving the touch alert signal 94. The remote user device 90 is further adapted to run a touch alert application 92 which informs the user upon receiving the touch alert signal 94 from the safety device 10. The touch alert application 92 may notify the user of the touch event via the display of the remote user device 90 and/or by playing an alert sound. In certain embodiments, the safety device 10 is adapted to transmit the touch alert signal 94 via a short ranged wireless communication protocol such as Bluetooth. However, in alternative embodiments, the wireless communication module 89 may be adapted to communicate with the remote user device 90 via a wide area network or WAN such as the Internet, such as by accessing a mobile data network or by communicating with the WAN via a wireless router.

Figure 6:
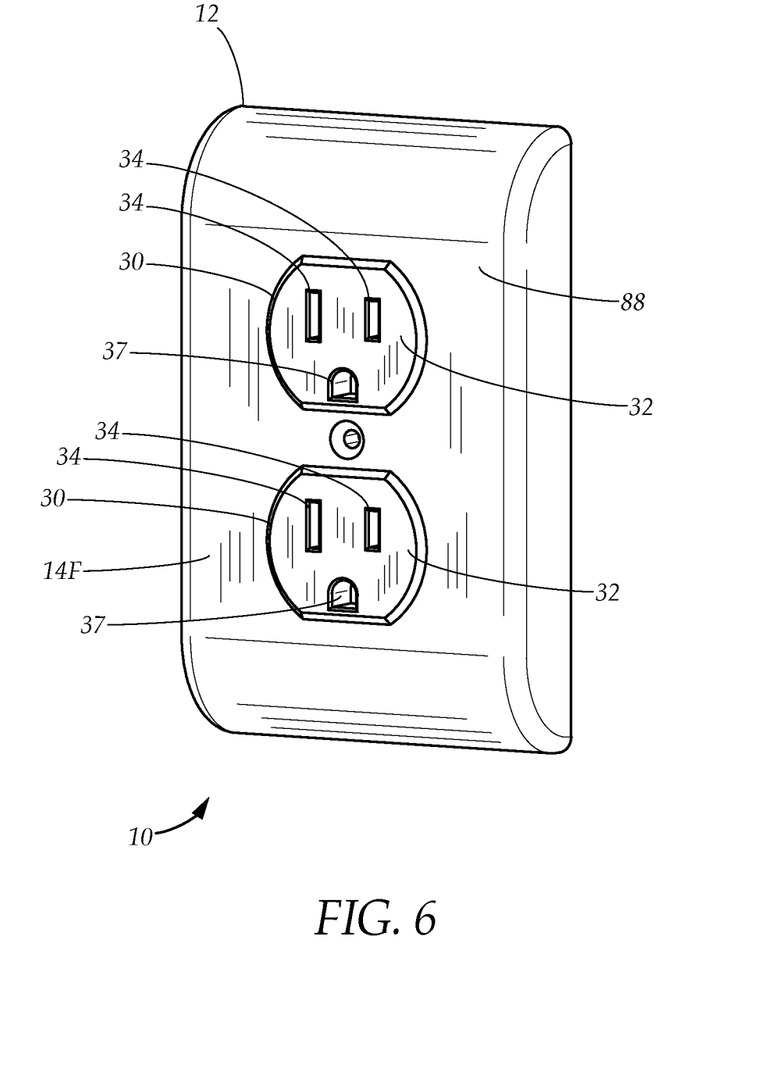
FIG. 6 is a diagrammatical perspective view of an embodiment of the safety device incorporating a plurality of simulated electrical sockets which visually resemble the electrical socket, in accordance with an embodiment of the present disclosure.

Referring now to FIGS. 6-7 while also referring to FIG. 3, the safety device 10 may further comprise a simulated electrical socket 30 positioned on the front face 14F. Although employing an embodiment of the safety device without the simulated electrical socket 30 would deter the person from contacting the safety device via producing the visual, audible, and tactile warnings, the person may not be deterred from contacting unsecured electrical sockets. Therefore, the simulated electrical socket 30 is adapted to have a visual resemblance to the electrical socket 40. The simulated electrical socket 30 is shaped to resemble the electrical socket 40, has a plurality of depressions 34, and may have a simulated ground depression 37. The simulated electrical socket 30 may also have a raised surface 32 which projects slightly from the front face 14F, and the depressions 34 and the simulated ground depression 37 are disposed thereupon. In a preferred embodiment, the simulated electrical socket 30 and the front face 14F are formed as a single continuous piece of material. The depressions 34 and the simulated ground depression 37 project inwardly away from the raised surface 32 toward the interior space 13, but do not project beyond a vertical plane 14FL defined by the front face 14F. The entirety of the simulated electrical socket 30, being continuous and coextensive with the front face 14F, forms a part of the touch-sensitive surface 88, and contact with the simulated electrical socket 30, including the depressions 34 or the simulated ground depression 37, will result in the occurrence of a touch event. Furthermore, in a preferred embodiment, the front face 14F, including the simulated electrical socket 30, is non-conductive. The incorporation of the simulated electrical socket 30 allows the safety device 10 to visually resemble the electrical socket 40 and thus serve as a teaching tool which reinforces the association of the unpleasant sensation of the visual, audible, and tactile warnings with the visual appearance of the electrical socket 40, thus deterring the person from contacting any electrical socket even in the absence of the safety device 10. Furthermore, the continuous and non-conductive front face 14F, and the simulated electrical socket 30 disposed thereon, forms a solid barrier preventing the person from gaining access to the interior space 13 or any of the components contained therein.

In some embodiments, the warning light 70 may be placed behind the simulated electrical socket 30. The simulated electrical socket 30 is translucent and can be illuminated by placing the warning light 70 within the interior space 13 proximate to the simulated electrical socket 30. The simulated electrical socket 30 is thus illuminated by the warning light 70 as it generates the visual warning.

Referring back to FIG. 2 while continuing to refer to FIGS. 3 and 6, the electrical socket 40 has a plurality of slots disposed in an arrangement corresponding to a standardized socket type which determines the number and shape of the slots. The electrical plug 20 has a plurality of prongs 22A, 22B adapted to match the socket type of the electrical socket 40, and the depressions 34 of the simulated electrical socket 30 are adapted to visually resemble the slots in accordance with the appropriate socket type. For example, the electrical socket may have a first slot 42A and a second slot 42B which are arranged in parallel, with the first slot 42A being taller than the second slot, and a ground slot 44. The depressions 34 and the simulated ground depression 37 are therefore shaped to visually resemble the first, second, and ground slots 42A, 42B, 44. Furthermore, the quantity and positioning of the electrical plugs 20 may be varied to allow the safety device 10 to be fitted to different electrical sockets of different configurations. For example, the electrical socket 40 may be found in a configuration of two vertically arranged electrical sockets 40 disposed within the faceplate 46. Accordingly, the safety device 10 may have two vertically arranged electrical plugs 20 adapted to align with the pair of electrical sockets 40.

In one embodiment, the safety device 10 may be secured within the electrical socket 40 by enlarging the prongs 22A, 22B of the electrical plug 20 such that each of the prongs 22A, 22B is slightly larger than the standard size and achieves a tight fit with the corresponding slot. For example, the size of each of the prongs 22A, 22B relative to the corresponding first and second slots 42A, 42B may allow the electrical plug 20 to be inserted into the electrical outlet, while also producing a retaining force as a result of frictional engagement between the prongs and the slots sufficient to prevent the electrical plug 20 from being removed by the person's hand, ensuring that the safety device 10 remains secured to the electrical socket 40. The enlargement of the prongs complements the role of the curved shape of the housing at preventing the person from detaching the safety device 10, and may be employed in place of, or in combination with the securing screw 19.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium (including, but not limited to, non-transitory computer readable storage media). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate or transport a program for use by or in connection with an instruction execution system, apparatus or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. Other types of languages include XML, XBRL and HTML5. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. Each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality and operation of possible implementations of systems, methods and computer program products according to various embodiments of the present disclosure. In this regard, each block in the flowchart or block diagrams may represent a module, segment or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The flow diagrams depicted herein are just one example. There may be many variations to this diagram or the steps (or operations) described therein without departing from the spirit of the disclosure. For instance, the steps may be performed in a differing order and/or steps may be added, deleted and/or modified. All of these variations are considered a part of the claimed disclosure.

In conclusion, herein is presented an electrical socket contact warning and safety device. The disclosure is illustrated by example in the drawing figures, and throughout the written description. It should be understood that numerous variations are possible, while adhering to the inventive concept. Such variations are contemplated as being a part of the present disclosure.

What is claimed is:

1. A safety device adapted to be secured to an electrical socket fastened within a faceplate, the faceplate having a screw hole, the electrical socket having a plurality of slots, the safety device comprising:
    a housing having a front face, a rear face, and an interior space formed between the front face and the rear face;
    an electrical plug which projects from the rear face and has a plurality of prongs adapted to align with and be inserted into the slots of the electrical socket such that the rear face is parallel and adjacent to the faceplate, whereby the housing is adapted to prevent a person from accessing the electrical socket once the electrical plug is inserted therein;
    a touch sensor, and a touch-sensitive surface corresponding to the front face of the housing, the touch sensor is adapted to detect an occurrence of a touch event corresponding to contact between a finger of the person and the touch-sensitive surface;
    a vibration motor adapted to generate a tactile warning corresponding to vibrations which are transferred through the housing and into the finger while the finger is in contact with the touch-sensitive surface; and
    a control module operably connected to the touch sensor and the vibration motor, the control module is adapted to cause the vibration motor to generate the tactile warning upon the occurrence of the touch event, whereby the tactile warning is adapted to deter the person from contacting the safety device.

2. The safety device as described in claim 1, wherein:
    the safety device further comprises a simulated electrical socket adapted to visually resemble the electrical socket, the simulated electrical socket has a raised surface which projects from the front face, and a plurality of depressions which project inwardly away from the raised surface but which do not project beyond a vertical plane defined by the front face, the touch-sensitive surface further includes the simulated electrical socket; and
    wherein the simulated electrical socket is adapted to allow the person to associate the tactile warning with contacting the electrical socket.

3. The safety device as described in claim 2, wherein:
the safety device further comprises a warning light adapted to produce a visual warning by lighting up;
the control module is operably connected to the warning light, and is further adapted to cause the warning light to produce the visual warning upon the occurrence of the touch event; and
wherein the warning light is adapted to allow the person to associate the visual warning and the tactile warning with contacting the electrical socket.

4. The safety device as described in claim 3, wherein:
the safety device further comprises a sound emitter adapted to generate an audible warning;
the control module is operably connected to the sound emitter and is further adapted to cause the sound emitter to produce the audible warning upon the occurrence of the touch event; and
wherein the audible warning is adapted to allow the person to associate the visual, audible, and tactile warnings with contacting the electrical socket.

5. The safety device as described in claim 4, wherein:
the control module further has a wireless communication module adapted to wirelessly communicate with a remote user device and wirelessly transmit a touch alert signal to the remote user device upon the occurrence of the touch event; and
wherein the remote user device is adapted to notify the user upon receiving the touch alert signal.

6. The safety device as described in claim 5, wherein:
the simulated electrical socket is translucent, and the warning light is disposed behind the simulated electrical socket and is adapted to illuminate the simulated electrical socket when producing the visual warning.

7. The safety device as described in claim 6, wherein:
the safety device further comprises a securing screw hole and a screw channel which passes through the housing from the front face to the rear face, the securing screw channel is adapted to align with the screw hole of the faceplate when the electrical plug is inserted into the electrical socket, and is further adapted to allow a securing screw to pass therethrough to fasten the safety device to the faceplate.

8. The safety device as described in claim 7, wherein:
the housing has a curved configuration and further has an upper curved portion, a lower curved portion, and a pair of curved side faces which project forwardly from the rear face and bend inwardly to join with the front face, whereby the upper and lower curved portions and the curved sides are continuous with the front face, the curved configuration of the housing is adapted to prevent the person from gripping the safety device by hand.

9. The safety device as described in claim 8, wherein:
the touch-sensitive surface further includes the upper and lower curved portions and the curved side faces.

10. The safety device as described in claim 9, wherein:
the prongs of the electrical plug are adapted to be slightly larger than the slots of the electrical socket, such that the prongs are adapted to frictionally engage the slots to generate a retaining force sufficient to prevent the person from detaching the electrical plug from the electrical socket by hand.

11. A safety device adapted to be secured to an electrical socket fastened within a faceplate, the faceplate having a screw hole, the electrical socket having a plurality of slots, the safety device comprising:

a housing having a front face, a rear face, and an interior space formed between the front face and the rear face;
a simulated electrical socket adapted to visually resemble the electrical socket, the simulated electrical socket is continuous with the front face and has a plurality of non-conductive depressions disposed on the front face adapted to visually resemble the slots of the electrical socket, but which do not extend inwardly beyond the front face;
an electrical plug which projects from the rear face and has a plurality of prongs adapted to align with and be inserted into the slots of the electrical socket such that the rear face is parallel and adjacent to the faceplate, whereby the housing is adapted to prevent a person from accessing the electrical socket once the electrical plug is inserted therein;
a touch sensor, and a touch-sensitive surface corresponding to the front face of the housing and the simulated electrical socket, the touch sensor is adapted to detect an occurrence of a touch event corresponding to contact between a finger of the person and the touch-sensitive surface;
a vibration motor adapted to generate a tactile warning corresponding to vibrations which are transferred through the housing and into the finger while the finger is in contact with the touch-sensitive surface; and
a control module operably connected to the touch sensor and the vibration motor, the control module is adapted to cause the vibration motor to generate the tactile warning upon the occurrence of the touch event, whereby the tactile warning is adapted to allow the person to associate the tactile warning with contacting the electrical socket and deter the person from contacting the safety device.

12. The safety device as described in claim 11, further comprising:
a warning light adapted to light up and produce a visual warning, the simulated electrical socket is translucent, and the warning light is positioned behind the simulated electrical socket and is adapted to illuminate the simulated electrical socket when producing the visual warning;
a sound emitter adapted to produce an audible warning; and
wherein the control module is operably connected to the warning light and the sound emitter, and is further adapted to cause the warning light and the sound emitter to produce the visual warning and the audible warning upon the occurrence of the touch event, wherein the visual, audible, and tactile warnings are adapted to allow the person to associate the warnings with contacting the electrical socket.

13. The safety device as described in claim 12, wherein:
the control module further has a wireless communication module adapted to wirelessly communicate with a remote user device and wirelessly transmit a touch alert signal to the remote user device upon the occurrence of the touch event; and
wherein the remote user device is adapted to notify the user upon receiving the touch alert signal.

14. The safety device as described in claim 13, wherein:
the safety device further comprises a securing screw hole and a screw channel which passes through the housing from the front face to the rear face, the securing screw channel is adapted to align with the screw hole of the faceplate when the electrical plug is inserted into the electrical socket, and is further adapted to allow a securing screw to pass therethrough to fasten the safety device to the faceplate.

15. A method for securing an electrical socket and preventing a person from gaining access thereto, the electrical socket is fastened within a faceplate having a screw hole, the electrical socket having a plurality of slots, the method comprising the steps of:

providing a safety device having:
- a housing having a front face and a rear face;
- an electrical plug which projects from the rear face and has a plurality of prongs adapted to align with and be inserted into the slots of the electrical socket;
- a simulated electrical socket which is non-conductive and positioned on the front face of the housing, the simulated electrical socket adapted to have a visual resemblance to the electrical socket;
- a touch-sensitive surface corresponding to the front face and the simulated electrical socket, whereby the housing has a touch sensor adapted to detect a touch event corresponding to contact between the touch-sensitive surface and a finger of the person;
- a vibration motor adapted to generate a tactile warning corresponding to vibrations which are transferred through the housing and into the finger of the person while the finger is in contact with the touch-sensitive surface; and
- a control module operably connected to the touch sensor, the vibration motor, the control module is adapted to cause the vibration motor to generate the tactile warning;

inserting the electrical plug into the electrical socket such that the rear face of the housing is parallel and adjacent to the faceplate, and blocking access by the person to the electrical socket using the housing of the safety device;

detecting the occurrence of the touch event upon the finger of the person contacting the touch-sensitive surface;

causing the vibration motor to generate the tactile warning, creating a simulated electric shock, and deterring the person from contacting the touch-sensitive surface; and deterring the person from contacting the electrical socket, creating an association whereby the safety device is adapted to allow the person to associate the tactile warning with the electrical socket to which the simulated electrical socket bears the visual resemblance.

16. The method as described in claim 15, wherein:

the safety device further comprises a warning light adapted to light up and generate a visual warning, and a sound emitter adapted to produce an audible warning, and the control module is operably connected to the warning light and the sound emitter and is adapted to cause the warning light and the sound emitter to generate the visual warning and the audible warning;

the step of causing the vibration motor to generate the tactile warning further comprises the steps of causing the warning light to generate the visual warning, causing the sonic emitter to generate the audible warning, and the step of deterring the person from contacting the electrical socket further comprises the steps of creating an association whereby the safety device is adapted to allow the person to associate the visual warning and the audible warning with the electrical socket to which the simulated electrical socket bears the visual resemblance.

17. The method as described in claim 16, wherein:

the step of providing the safety device is preceded by the step of:

providing a remote user device which is operably connected to a network and is adapted to execute a touch alert application;

the control module further has a wireless communication module which is adapted to wirelessly communicate with the remote user device via the network and transmit a touch alert signal; and the step of detecting the occurrence of the touch event is followed by the step of:

transmitting the touch alert signal to the remote user device upon detecting the touch event, and warning the user of the touch event via the touch alert application.

18. The method as described in claim 17, wherein:

the prongs of the electrical plug are adapted to be slightly smaller larger than the slots of the electrical socket, such that the prongs are adapted to frictionally engage the slots to generate a retaining force sufficient to prevent the person from detaching the electrical plug from the electrical socket by hand; and the step of inserting the electrical plug into the electrical socket is followed by the step of:

preventing the person from detaching the electrical plug from the electrical socket by the retaining force between the prongs of the electrical plug and the slots of the electrical socket.

19. The method as described in claim 18, wherein:

the housing has a curved configuration whereby the front face is connected to the rear face via an upper curved portion, a lower curved portion, and a pair of curved side faces; and the step of preventing the person from detaching the electrical plug further comprises the step of preventing the person from overcoming the retaining force via the curved configuration of the housing.

20. The method as described in claim 19, wherein:

the housing further has a securing screw hole and a securing screw channel which passes through the housing from the front face to the rear face and is adapted to align with the screw hole of the faceplate, and a securing screw adapted to pass through the securing screw channel and the screw hole;

the step of preventing the person from detaching the electrical plug is followed by the step of:

inserting a securing screw through the securing screw hole, the securing screw channel, and the screw hole of the faceplate, and preventing the person from removing the safety device by fastening the safety device to the faceplate.

* * * * *